United States Patent
Horie

(10) Patent No.: US 6,621,400 B2
(45) Date of Patent: Sep. 16, 2003

(54) ELECTRONIC PART AND A COMPLEX ELECTRONIC DEVICE

(75) Inventor: Kenichi Horie, Tokyo (JP)

(73) Assignee: Koninklijke Philips Electronics N.V., Eindhoven (NL)

( * ) Notice: Subject to any disclaimer, the term of this patent is extended or adjusted under 35 U.S.C. 154(b) by 47 days.

(21) Appl. No.: 09/937,418

(22) PCT Filed: Jan. 26, 2001

(86) PCT No.: PCT/EP01/00842

§ 371 (c)(1),
(2), (4) Date: Sep. 26, 2001

(87) PCT Pub. No.: WO01/56044

PCT Pub. Date: Aug. 2, 2001

(65) Prior Publication Data

US 2002/0153987 A1 Oct. 24, 2002

(30) Foreign Application Priority Data

Jan. 27, 2000 (JP) .......................................... 2000/19335

(51) Int. Cl.⁷ ................................................. H01F 5/00
(52) U.S. Cl. ......................... 336/200; 336/223; 336/232
(58) Field of Search ................................. 336/200, 223, 336/232

(56) References Cited

U.S. PATENT DOCUMENTS

| | | | | |
|---|---|---|---|---|
| 5,051,712 A | | 9/1991 | Naito et al. ................. 333/185 |
| 5,250,923 A | * | 10/1993 | Ushiro et al. ................. 336/83 |
| 5,392,019 A | | 2/1995 | Ohkubo ....................... 336/200 |
| 5,461,353 A | | 10/1995 | Eberhardt .................... 333/246 |
| 5,583,470 A | * | 12/1996 | Okubo ......................... 333/185 |
| 6,115,264 A | * | 9/2000 | Nosaka ........................ 361/821 |
| 6,285,273 B1 | * | 9/2001 | Morikawa .................... 336/200 |

FOREIGN PATENT DOCUMENTS

WO    0074142 A1    12/2000

* cited by examiner

*Primary Examiner*—Anh Mai
(74) *Attorney, Agent, or Firm*—Steven R. Biren

(57) ABSTRACT

An electronic part and a complex electronic device each include a substrate that contains at least one material selected from a dielectric material and a magnetic material and two or more coils that are formed in the inside of the substrate. The coils are in the form of spirals and extend in a predetermined direction. The electronic part and the complex electronic device each also include two grounding electrodes that are located in the inside or the outer surface of the substrate, the two grounding electrodes being aligned in the predetermined direction in such a way that the two or more coils are located between the two ground electrodes. Additionally the electronic part and the complex electronic device each include first filter and a second filter located in the inside of the substrate. The first filter contains at least one of the two or more coils, and the second filter contains at least one other of the two or more coils. The first filter and the second filter have the mutually different pass-bands.

16 Claims, 5 Drawing Sheets

ELECTRONIC PART AND A COMPLEX ELECTRONIC DEVICE

TECHNICAL FIELD

The invention relates to an electronic part comprising at least two coils. The invention relates to an electronic device comprising such electronic parts. The inventor further relates to a mobile phone.

BACKGROUND OF THE INVENTION

In recent years, mobile telephones have been available commonly, which transmit and receive two different frequency bands. These mobile telephones may be provided with, for example, a pair of low-pass filter (referred to as LPF hereinafter) and high-pass filter (referred to as HPF hereinafter) that will separate the received signals into lower frequency signals and higher frequency signals. In this case, if both filters are differently implemented onto different parts, it may become rather difficult to realize a compact size and a low weight for mobile telephones. Accordingly, recent techniques tend to integrate LPF and HPF into a single chip part. However, if such integration is not carefully designed, respective frequency characteristics of the LPF and the HPF tend to fluctuate due to the interference between the LPF and the HPF. For this reason, a shield electrode between the LPF and the HPF may be useful in order to eliminate such interference between the LPF and the HPF. Thus, a shield electrode can be used to allow for the integration of the LPF and the HPF.

Nevertheless, there are severe limitations that are posed upon a size in height for electronic parts embedded into such devices as mobile telephones requiring a small size. For example, there exists a problem that it may be difficult to adapt the height of integrated chip parts within a desired dimension of height if integrated chip parts are produced through integrating LPF and HPF in a vertical direction. Accordingly, it seems to be better to arrange the LPF and the HPF together in parallel in the horizontal direction to produce an integrated chip part. However, because such chip parts are usually produced by stacking dielectric layers on which electrode patterns are printed, there still exist a problem that it may be quite difficult to form a shield electrode between the LPF and the HPF when those LPF and HPF should be together laid down laterally (namely horizontally).

To resolve the above-mentioned problem, the Japan Patent Application No. 1998-117117 discloses a high frequency part wherein respective patterns of the inductance and the capacitance are so arranged as to eliminate the interference between the LPF and the HPF without providing any shield electrode. However, the disclosed part should be designed to broaden the space between the LPF and the HPF in order to eliminate the interference between the LPF and the HPF, which may be resulted in a difficulty in achieving the compact size of such part.

Accordingly, it is an object of the invention to provide an electronic part that needs no shield electrode but can have a smaller size and also to provide an electronic device comprising a plurality of such electronic parts.

SUMMARY OF THE INVENTION

To achieve the above-described object, the invention provides an electronic part that comprises a substrate that contains at least one material selected from a dielectric material and a magnetic material, two or more coils, formed in the inside of the said substrate, that take the form of a spiral and extend in a predetermined direction, and two grounding electrodes that are located in the inside or the outer surface of the said substrate, the said two grounding electrodes being aligned in the said predetermined direction in such a way that the two or more coils are located between the two ground electrodes.

The two or more coils of the inventive electronic part are of a type of coil that takes a spiral form and extends to a predetermined direction, in addition, two grounding electrodes are aligned in that predetermined direction with the two or more coils located between the two ground electrodes. Since any extension of the magnetic flux generated by each of the coils may be limited by those two grounding electrodes, a degree of coupling of such magnetic flux may be increased. Therefore, when the inventive electronic part is given some characteristics like a filtering characteristics, a degree of coupling of the magnetic flux generated by these coils might be considered as a major decision factor to determine the filtering characteristics. Thus, it will be possible to give a desired filtering characteristics to the inventive electronic part by considering a degree of coupling of the magnetic flux generated by these coils to design such filtering characteristics. Therefore, in order to gain a desired filtering characteristics, the inventive electronic part is designed in such a way that coupling of magnetic flux generated by these coils is positively promoted. By doing so, it will be possible to locate two or more coils so closely each other as to increase a degree of coupling of the magnetic flux generated by coils, which may be resulted in a compact size of the electronic part.

Therefore, in the inventive electronic part, the said two or more coils are preferably formed within such area of the said substrate that is sandwiched by the said two grounding electrodes. With such structure, the two grounding electrodes may efficiently function as a shield electrode and as a result magnetic flux generated by coils could be coupled without any significant influence from the external environment.

Besides, the said two or more coils of the inventive electronic part is preferably designed to make a spiral form having at least one round. Thus, the magnetic flux generated by each coil may be further reinforced.

The inventive electronic part may further comprise an external electrode that is located in the said outer surface of the said substrate, wherein at least one coil among the said two or more coils maintains no contact with the said external electrode. No contact of a coil with the external coil is allowed in the inventive electronic part.

Besides, the electronic part may preferably comprise an internal electrode that is located between one of the said two grounding electrodes and at least one coil among the said two or more coils, so that such capacitor that comprises the internal electrode and the grounding electrodes can be formed.

Furthermore, the inventive electronic part may preferably comprise a first filtering means, located in the said inside of the said substrate, that contains at least one coil among the said two or more coils and a second filtering means, located in the said inside of the said substrate, that contains at least one other coil than the said coil or coils contained in the said first filtering means, wherein the said first filtering means and the said second filtering means have the respective pass-bands belonging to the different frequency ranges. With such structure, it will be possible to separately retrieve, from one electronic part, some signals each of which has a unique frequency band belonging to a different frequency range.

In addition, the invention provides an electronic device comprising a first electronic part and one or more second electronic parts mounted on the said first electronic part. Furthermore, in the complex electronic device, at least one of the said first and second electronic parts comprises a substrate that contains at least one material selected from a dielectric material and a magnetic material, two or more coils, formed in the inside of the said substrate, that take a spiral form and extend in a predetermined direction and two grounding electrodes, located in the inside or the outer surface of the said substrate, that are aligned in the said predetermined direction in such a way that the two or more coils are located between the two ground electrodes.

In particular, the inventive electronic device is designed to mount one or more second electronic parts on the first electronic part, so that when such electronic device is mounted on a circuit board, it may also be possible to mount second electronic parts on that circuit board only by providing a sufficient area to mount the first electronic part on the circuit board. As a result it may be possible to efficiently mount a number of electronic parts on the substrate.

DETAILED DESCRIPTION OF THE INVENTION

Figure 1:
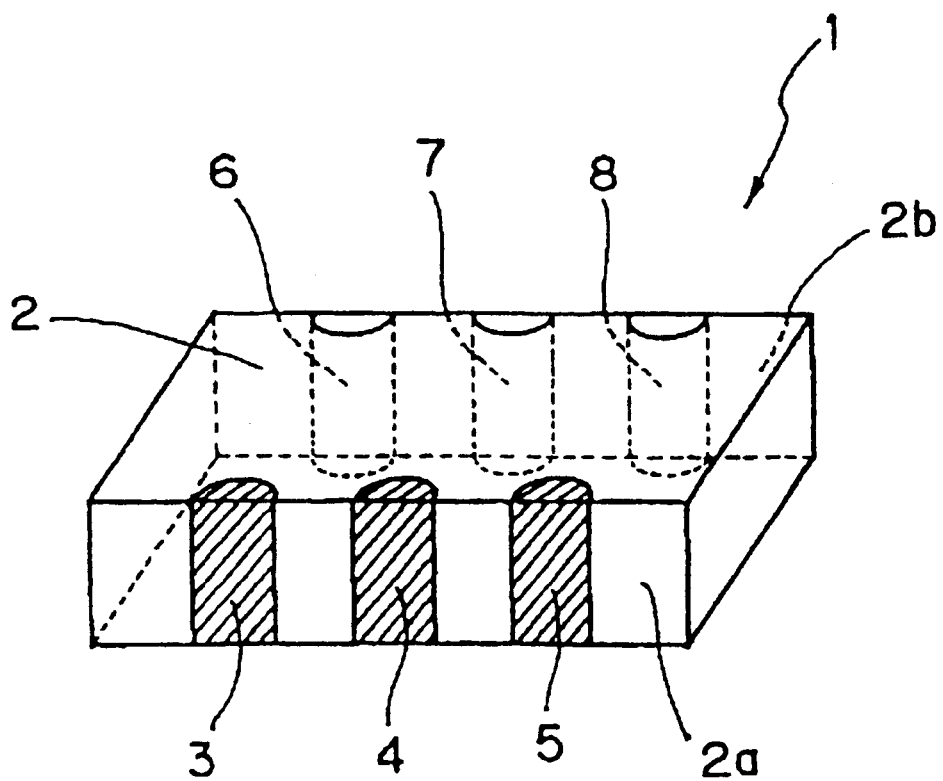
FIG. 1 illustrates a perspective view of a high frequency part 1 in accordance with one embodiment of the invention.

FIG. 1 illustrates a perspective view of a high frequency part 1 implemented in one embodiment in accordance with the invention. The high frequency part 1 comprises a dielectric substrate 2 taking the form of a rectangular solid. The dielectric substrate 2 is formed by a material that contains ceramics as its principal ingredient. Two output terminals 3, 5 and a grounding terminal 4 are provided on the front side 2a of the dielectric substrate 2 and two grounding terminals 6, 8 and an input terminal 7 are provided on the other side 2b. Additionally, some electrodes including grounding electrodes (explained later) are provided in the inside of the dielectric substrate 2. It should be noted that these terminals 3–8 correspond to external electrodes in the invention.

Figure 2:
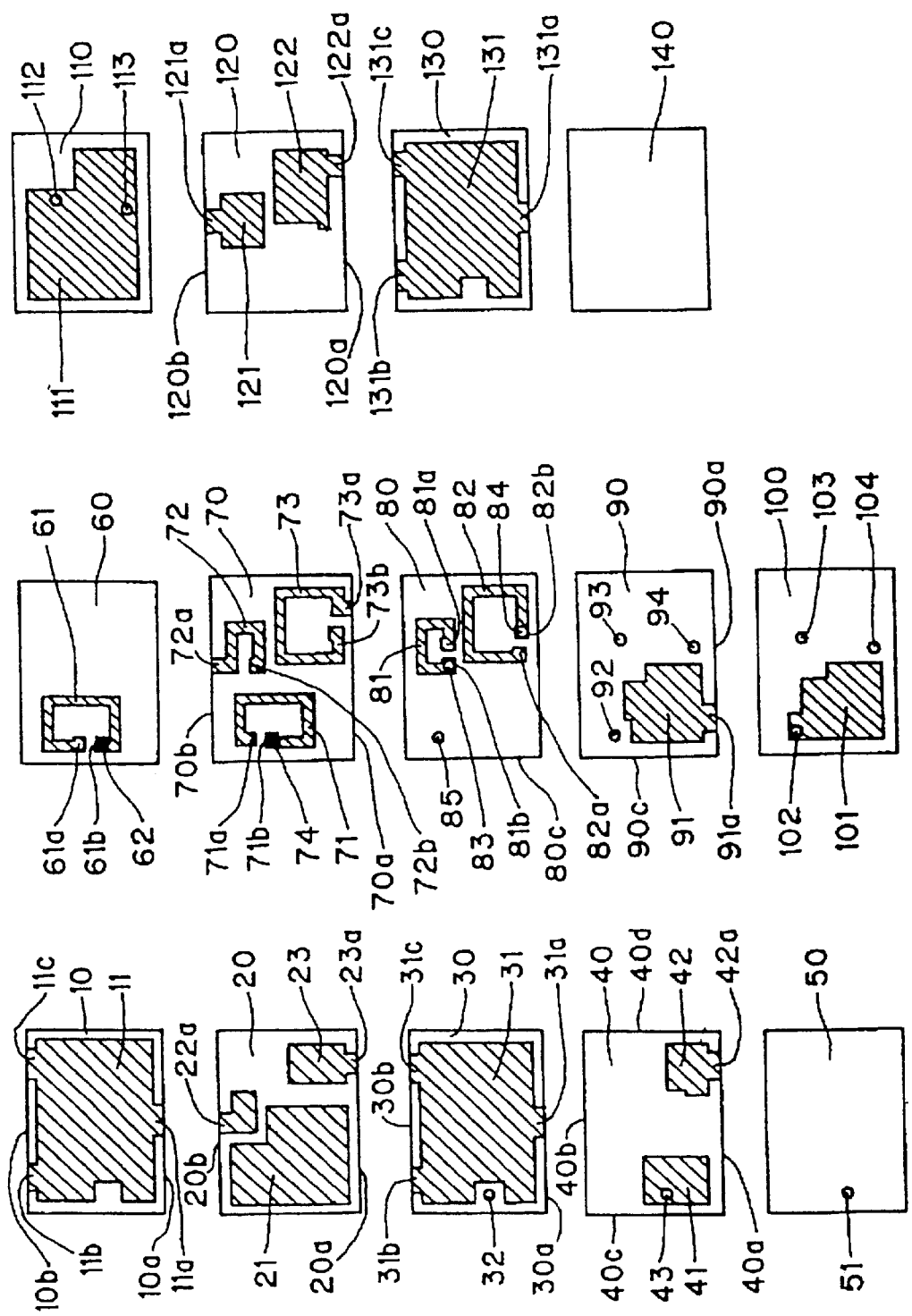
FIG. 2 illustrates a plane view of a plenty of dielectric layers obtained by dividing a dielectric substrate 2 into the plenty of dielectric multiple layers, the dielectric substrate 2 provided on the high frequency part 1 shown in FIG. 1.
Figure 3:
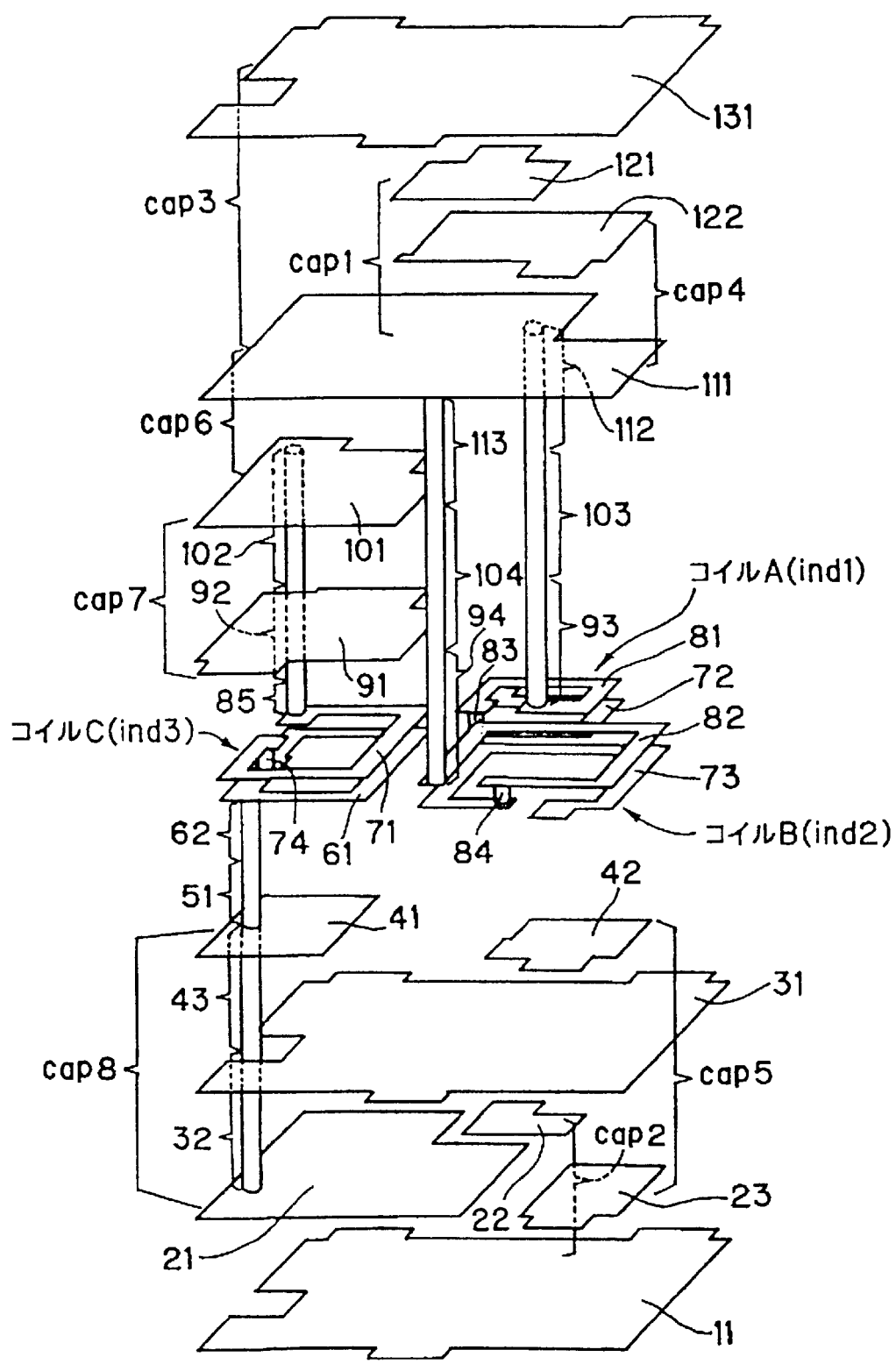
FIG. 3 illustrates a perspective view of each of the electrodes such as grounding electrodes formed within the dielectric substrate 2.

FIG. 2 illustrates a plane view of a plenty of dielectric layers obtained by dividing a dielectric substrate 2 into the plenty of dielectric multiple layers, the dielectric substrate 2 provided on the high frequency part 1 shown in FIG. 1. FIG. 3 illustrates a perspective view of each of the electrodes such as grounding electrodes formed within the dielectric substrate 2. FIG. 2 illustrates a plane view of fourteen dielectric layers 10–140 that constitute the dielectric substrate 2. The dielectric layer 10 shown at the left top of FIG. 2 is the bottom layer of the dielectric substrate 2 and the dielectric layer 140 shown on the right bottom of FIG. 2 is the top layer of the dielectric substrate 2.

A grounding electrode 11 is provided in a dielectric layer 10 that is the bottom 10 layer of the dielectric substrate 2. It occupies almost all area of the layer 10. The grounding electrode 11 has a end portion 11a that is located so as to contact with one longer side 10a of the dielectric layer 10 and two end portions 11b, 11c that are located so as to contact with the other longer side 10b of the dielectric layer 10.

On the surface of a dielectric layer 20 that is stacked just above the dielectric layer 10, three electrodes to be used for capacitors (referred to as condenser electrodes hereinafter) 21, 22 and 23 are provided. The condenser electrode 21 is located in the left half of the dielectric layer 20. The condenser electrode 22 takes the form of a letter L, the end portion 22a of which is located so as to contact with one longer side 20b of the dielectric layer 20. Additionally, the condenser electrode 23 takes the form of a rectangle, the end 10 portion 23a of which is located so as to contact with the other longer side 20a of the dielectric layer 20. These three condenser electrodes 21, 22 and 23 are located, through the dielectric layer 20, oppositely with the grounding electrode 11 mounted in the bottom dielectric layer 10.

On the surface of a dielectric layer 30 that is stacked just above the dielectric 25 layer 20, a grounding electrode 31 is provided, which takes the same form as the grounding electrode 11 provided in the bottom dielectric layer 10. The three condenser electrodes 21, 22 and 23 of the dielectric layer 20 are located, through the upper dielectric layer 30, oppositely with the grounding electrode 31. Thus, the three condenser electrodes 21, 22 and 23 are located, through the respective dielectric layers 20 and 30, oppositely with the grounding 30 electrodes 11 and 31. Besides, the dielectric layer 30 has a via-hole electrode 32 that passes through the dielectric layer 30. The via-hole electrode 32 is connected to the condenser electrode 21 mounted in the under layer 20.

Further, another dielectric layer 40 is stacked just above the dielectric layer 30. A condenser electrode 41 is provided near to one shorter side 40c of the surface of the dielectric layer 40 and a condenser electrode 42 is provided near to the other shorter side 40d of the surface of the dielectric layer 40. An end portion 42a of the condenser electrode 42 contacts with one longer side 40a of the dielectric layer 40. Besides, the dielectric layer 40 has a via-hole electrode 43 that passes through the dielectric layer 40. The via-hole electrode 43 is connected to the condenser electrode 41 and further connected to the via-hole electrode 32 mounted in the under layer 30. Thus, the condenser electrode 41 is connected to condenser electrode 21 in the dielectric layer 20 through the two via-hole electrodes 32 and 43 (see FIG. 3). Another dielectric layer 50 is stacked just above the dielectric layer 40. The dielectric layer 50 has a via-hole electrode 51 that passes through the dielectric layer 50. The via-hole electrode 51 is connected to the via-hole electrode 43 mounted in the under layer 40.

Furthermore, dielectric layers 60, 70 and 80 are stacked in sequence just above the dielectric layer 50. The dielectric layer 60 has a coil electrode 61 of a loop form having two end portions 61a and 61b in the left half of its surface area. The end portion 61b of the coil electrode 61 is connected to a via-hole electrode 62 passing through the dielectric layer 60. In addition, the via-hole electrode 62 is connected to the via-hole electrode 51 in the under layer 50. Thus, the coil electrode 61 is connected to the condenser electrode 41 through the two via-hole electrodes 51 and 62 (see FIG. 3). The dielectric layer 70 also includes a coil electrode 71 of a loop form having two end portions 71a and 71b in the left half of its surface area. The end portion 71b of the coil electrode 71 is connected to a via-hole electrode 74 passing through the dielectric layer 70. The via-hole electrode 74 is connected to the end portion 61a of the coil electrode 61 in the under layer 60. Thus, the coil electrode 61 and 71 provided in the respective dielectric layers 60 and 70 are connected to each other through the via-hole electrodes 74.

As illustrated in FIG. 3, the two coils 61, 71 and the via-hole electrode 74 together constitute a coil C in the form of a spiral having about two rounds. In particular, the coil C is oriented in the vertical direction (in the stacking direction of the dielectric layers 10–140) while taking the form of a spiral because the two coils 61 and 71 are arranged in the vertical direction (in the stacking direction of the dielectric layers 10–140) so as to sandwich the via-hole electrode 74.

As illustrated in FIG. 2, the dielectric layer 70 has coil electrodes 72 and 73 in addition to the coil electrodes 71 on its surface. The coil electrode 72 has two end portions 72a and 72b. The end portion 72a contacts with one longer side 70b of the dielectric layer 70. The coil electrode 73 also has two end portions 73a and 73b. The end portion 73a contacts with the other longer side 70a of the dielectric layer 70.

Furthermore, another dielectric layer 80 is stacked just above the dielectric layer 70. The dielectric layer 80 has a coil electrode 81. The coil electrode 81 has two end portions 81a and 81b. The end portion 81b is connected to a via-hole electrode 83 passing through the dielectric layer 80. In addition, the via-hole electrode 83 is connected to the end portion 72b of the coil electrode 72 mounted in the under layer 70. Thus, coil electrodes 81 and 72 are connected to each other through the via-hole electrode 83. As illustrated in FIG. 3, the coils 81, 72 and the via-hole electrode 83 together constitute a coil A in the form of a spiral having about two rounds. In particular, the coil A, in the same fashion for the coil C as above described, is oriented in the vertical direction while taking the form of a spiral because the two coils 81 and 72 are arranged in the vertical direction so as to sandwich the via-hole electrode 83.

Besides, as illustrated in FIG. 2, the dielectric layer 80 has another coil electrode 82 in addition to the coil 81 on its surface. The coil electrode 82 has two end portions 82a and 82b. The end portion 82b is connected to another via-hole electrode 84. In addition, the via-hole electrode 84 is connected to the end portion 73b of the coil electrode 73 mounted in the under layer 70. Thus, coil electrodes 82 and 73 are connected to each other through the via-hole electrode 84. As illustrated in FIG. 3, the coil electrodes 82, 73 and the via-hole electrode 84 together constitute a coil B in the form of a spiral having about two rounds. In particular, the coil B, in the same fashion for the coil A and the coil C as above described, is oriented in the vertical direction while taking the form of a spiral because the two coils 82 and 73 are arranged in the vertical direction so as to sandwich the via-hole electrode 84.

Just above the dielectric layer 80, further dielectric layers 90 and 100 are stacked in sequence as illustrated in FIG. 2. The electric layers 90 and 100 have respective condenser electrodes 91 and 101 in their respective left half areas. The condenser electrode 91 mounted in the dielectric layer 90 has an end portion 91a that contacts with one longer side 90a of the electric layer 90. The condenser electrodes 91 and 101 sandwich the dielectric layer 100 so as to be located oppositely each other. The dielectric layer 90 has a via-hole electrode 92, near to its shorter side 90c, which passes through the dielectric layer 90. The dielectric layer 100 also has a via-hole electrode 102 connected to the via-hole electrode 92. The via-hole electrode 102 is connected to the condenser electrode 101. It should be noted here that the dielectric layer 80, near to its shorter side 80c, has a via-hole electrode 85 passing through the dielectric layer 80. The via-hole electrode 85 is connected to the via-hole electrode 92 mounted in the upper layer 90 and further connected to the end portion 71a of the coil electrode 71 in the under layer 70. Thus, the coil electrode 71 and the condenser electrode 101 are connected to each other through three via-hole electrodes 85, 92 and 102 (see FIG. 3).

Furthermore, another dielectric layer 110 is stacked just above the dielectric layer 100. The dielectric layer 110 has an internal electrode 111 on its surface. The internal electrode 111 is located, through the dielectric layer 110, oppositely with the condenser electrode 101 of the under layer 100. It should be noted here that the dielectric layer 90, on the right side of the condenser electrode 91, has two via-hole electrodes 93 and 94 that pass through the dielectric layer 90. The via-hole electrode 93 is connected to the end portion 81a of the coil electrode 81 in the under layer 80 whereas the other via-hole electrode 94 is connected to the end portion 82a of the coil electrode 82 in the under layer 80. The dielectric layer 100, on the right side of the condenser electrode 101, also has two via-hole electrodes iffy 103 and 104 that pass through the dielectric layer 100. These via-hole electrodes 103 and 104 are connected to the via-hole electrodes 93 and 94 of the under layer 90 respectively.

In addition, the dielectric layer 110 has two via-hole electrodes 112 and 113 that pass through the dielectric layer 110. The via-hole electrodes 112 and 113 are connected to the via-hole electrodes 103 and 104 of the under layer 100, respectively. The two via-hole electrodes 112 and 113 further are connected to the internal electrode 111. Thus, the coil electrode 81, one of the two coil electrodes 81 and 82 mounted in the dielectric layer 80, is connected to the internal electrode 111 mounted in the dielectric layer 110 through the three via-hole electrodes 93, 103 and 112, and the other coil electrode 82 is connected to the internal electrode 111 through the three via-hole electrodes 94, 104 and 113 (see FIG. 3). Furthermore, another dielectric layer 120 is stacked just above the dielectric layer 110. The dielectric layer 120 has two condenser electrodes 121 and 122 on its surface. An end portion 121a of the condenser electrode 121 contacts with one longer side 120b of the dielectric layer 120 and an end portion 122a of the condenser electrode 122 contacts with the other longer side 120a of the dielectric layer 120. Another dielectric layer 130 is further stacked just above the dielectric layer 120. The dielectric layer 130 has, on its surface, a grounding electrode 131 that takes the same form as in grounding electrodes 11 and 31 in the dielectric layers 10 and 30 respectively. Thus, the two condenser electrodes 121 and 122 mounted in the dielectric layer 120 are located oppositely with the grounding electrode 111 mounted in the under layer 110 through the dielectric layer 120 and also located oppositely with the grounding electrode 131 through the dielectric layer 130. Further, another dielectric layer 140 is stacked just above the dielectric layer 130.

Thus, the three grounding electrodes 11, 31 and 131 provided within the dielectric substrate 2 as constructed above are aligned in the vertical direction and three coils A, B and C are formed between the grounding electrode 31 and the grounding electrode 131. The output terminal 3, one of the output terminals 3 and 5 (see FIG. 1) provided on the side surface of such dielectric substrate 2, is connected to the end portion 91a of the condenser electrode 91 (see FIG. 2). On the other hand, the output terminal 5 is connected to the end portions 23a, 42a, and 122a of the condenser electrodes 23, 42 and 122 respectively as well as the end portion 73a of the coil electrode 73, so that the condenser electrodes 23, 42 and 122 and the coil electrode 73 are connected to each other. Also, the input terminal 7 (see FIG. 1) provided on the side surface of the dielectric substrate 2 is connected to the end portions 22a and 121a of the condenser electrodes 22 and 121 respectively as well as the end portion 72a of the coil electrode 72, so that the condenser electrodes 22 and 121 and the coil electrode 72 are connected to each other.

Besides, the grounding terminal 4, one of the three grounding terminals 4, 6 and 8 provided on the side surface of the dielectric substrate 2, is connected to the end portions 11a, 31a and 131a of the grounding electrodes 11, 31 and 131 respectively, the grounding terminal 6 is connected to the end portions 11b, 31b and 131b of the grounding electrodes 11, 31 and 131 respectively, and the grounding terminal 8 is connected to the end portions 11c, 31c and 131c of the grounding electrodes 11, 31 and 131 respectively. Thus, three grounding electrodes 11, 31 and 131 are connected to each other.

Figure 4:
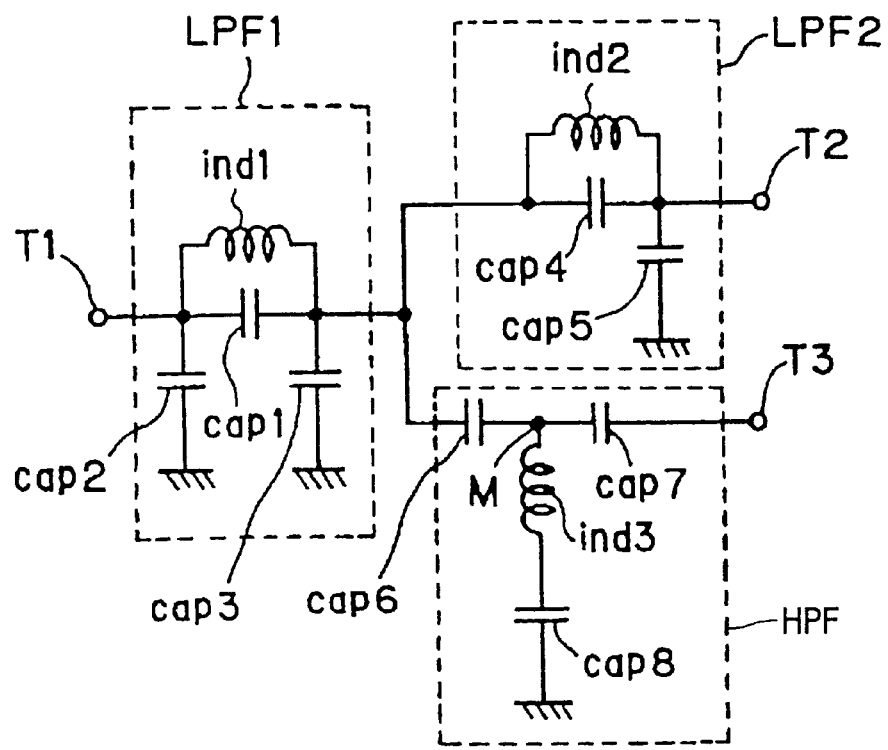
FIG. 4 illustrates an equalizing circuit of the high frequency part shown in FIG. 1.

FIG. 4 illustrates an equalizing circuit of the high frequency part shown in FIG. 1. The equalizing circuit shown in FIG. 4 consisted of two low-pass filters LPF1 and LPF2 and a high-pass filter HPF. The low-pass filter LPF1 is located at the first stage of the equalizing circuit so as to connect with a terminal T1, and then the low-pass filter LPF2 and the high-pass filer HPF are located at the subsequent stage. The low-pass filter LPF2 and high-pass filer HPF are connected to the preceding low-pass filter LPF1 on one side and are connected to terminals T2 and T3 respectively on the other side as illustrated in FIG. 4.

The low-pass filter LPF1 includes an inductor ind2 and a capacitor cap1 that are connected in parallel to each other. Both end portions of these inductor 1nd1 and capacitor cap1 are grounded through capacitors cap2 and cap3.

The low-pass filter LPF2 includes an inductor ind2 and a capacitor cap4 that are connected in parallel to each other. End portions, located on the side of the terminal T2, of these inductor ind2 and capacitor cap4 are grounded through a capacitors cap5.

The high-pass filter HPF includes two capacitors cap6 and cap7 that are connected in series. A central connection point M of these capacitors cap6 and cap7 is grounded through an inductor ind3 and a capacitor cap8 that are connected in series.

It should be noted that a combination of the two low-pass filters LPF1 and LPF2 corresponds to a first filtering means in the invention and a combination of the low-pass filter LPF1 and the high-pass filter HPF corresponds to a second filtering means in the invention. The two low-pass filters LPF1 and LPF2, which correspond to the first filtering means in the invention, contain the coils A and B (see FIG. 3) whereas the low-pass filter LPF1 and the high-pass filter HPF, which correspond to the second filtering means in the invention, contain the coils A and C (see FIG. 3). In other words, the combination of the low-pass filter LPF1 and the high-pass filter HPF, which correspond to the second filtering means in the invention, contains the coil C that is different from the coils A and B contained in the combination of the two low-pass filters LPF 1 and LPF2 corresponding to the first filtering means in the invention.

Now, by referring to FIG. 1, FIG. 3 and FIG. 4, it will be explained that the relationship between each electrode formed in substrate 2 shown in FIG. 1 and inductor and capacitor of the LPF1, LPF2, HPF shown in FIG. 4.

The inductor ind1 included in the low-pass filter LPF1 is formed by the coils 72 and 81 connected to each other through the via-hole electrode 83 (in other words, the inductor ind1 corresponds to the coil A). Besides, the capacitor cap 1 is formed by the internal electrode 111 and the condenser electrode 121. The coil electrode 81, one of the coil electrodes 72 and 81, is connected to the internal electrode 111 through the via-hole electrodes 93, 103 and 112, and the other coil electrode 72 is connected to the condenser electrode 121 through the input terminal 7 (FIG. 1), so that the inductor ind1 and the capacitor cap2 are connected in parallel to each other as illustrated in FIG. 4. The capacitor cap2 is formed by the condenser electrode 22 and the grounding electrode 11, and the capacitor cap3 is formed by the internal electrode 111 and the grounding electrode 131. The condenser electrode 22 is connected to the coil electrode 72 through the input terminal 7 (FIG. 1) and the internal electrode 111 is connected to the coil electrode 81 through the via-hole electrodes 93, 103 and 112, so that both end portions of these inductor ind1 and capacitor cap1 are grounded through the capacitors cap2 and cap3 (namely, the both end portions are connected to the grounding electrodes 11 and 131) as illustrated in FIG. 4.

Furthermore, the inductor ind2 included in the low-pass filter LPF2 is formed by the coils 73 and 82 connected to each other through the via-hole electrode 84 (in other words, the inductor ind2 corresponds to the coil B). Besides, the capacitor cap4 is formed by the internal electrode 111 and the condenser electrode 122. The coil electrode 82, one of the coil electrodes 73 and 82, is connected to the internal electrode 111 through the via-hole electrodes 94, 104 and 113 and the other coil electrode 73 is connected to the condenser electrode 122 through the output terminal 5 (FIG. 1), so that the inductor ind2 and the capacitor cap4 are connected in parallel to each other as illustrated in FIG. 4. The capacitor cap5 is formed by the grounding electrode 31 and the condenser electrodes 23, 42 located so as to vertically sandwich the grounding electrode 31. These condenser electrodes 23 and 42 are connected to the coil electrode 73 through the output terminal 5 (FIG. 1), so that end portions of the inductor ind2 and capacitor cap4 are grounded (namely, are connected to the grounding electrode 31) through the capacitors cap5.

Besides, the capacitor cap6 included in the high-pass filter HPF is formed by the internal electrode 111 and the condenser electrode 101 whereas the capacitor cap7 is formed by the condenser electrodes 91 and 101. The internal electrode 111 and the condenser electrode 91 are located so as to vertically sandwich the condenser electrode 101, so that the capacitors cap6 and cap7 are connected in series as illustrated in FIG. 4. The inductor ind3 is formed by the coil electrodes 61 and 71 connected to each other through the via-hole electrode 74 (in other words, the inductor ind3 corresponds to the coil C). Additionally, the capacitor cap8 is formed by the grounding electrode 31 and the condenser electrodes 21, 41 located so as to vertically sandwich the grounding electrode 31. The coil electrode 61 is connected to the condenser electrode 41 through the via-hole electrodes 51 and 62, so that the inductor ind3 and the capacitor cap8 are connected in series as illustrated in FIG. 4. Besides, the coil electrode 71 is connected, through the via-hole electrodes 85, 92 and 102, to the condenser electrode 101 shared by the two capacitors cap6 and cap7, and accordingly the inductor ind3 is connected to the central point M of the capacitors cap6 and cap7 as illustrated in FIG. 4.

As above described, the terminals 3–8 are located in the outer surface of the dielectric substrate 2 as illustrated in FIG. 1 and the three coils A, B and C are formed in the inside of the dielectric substrate 2 as illustrated in FIG. 3. It should be noted here that the coil A and B among these three coils A, B and C are respectively connected to the input terminal 7 and the output terminal 5 located in the outer surface of the dielectric substrate 2 but the coil C does not connect with any of the terminals 3–8 located in the outer surface of the dielectric substrate 2; namely the coil C is formed keeping no contact with the terminals 3–8.

In the above-described embodiment of the high frequency part, the three inductors ind1, ind2 and ind3, without providing any shield electrode among them, are located closely each other for making their magnetic coupling easier, and additionally these three inductors ind1, ind2 and ind3 are positioned between the two grounding electrode 31 and 131 extending horizontally. Thus, any extension of the magnetic flux generated by each of the inductors ind1, ind2 and ind3 may be limited, and the coupling of such magnetic flux may be reinforced. Particularly, in this embodiment, each of these three inductors ind1, ind2 and ind3 is designed to be located within the area sandwiched by the two grounding electrodes 31 and 131. Thus, the two grounding electrodes 31 and 131 serve to efficiently function as a shield electrode, so the magnetic flux generated by each of the inductors ind1, ind2 and ind3 may be coupled without receiving significant external influences.

As explained above, in the high frequency part shown in FIG. 1, the coupling of the magnetic flux generated by each of the inductors ind1, ind2 and ind3 is rather strong, so the filtering characteristics for each of the low-pass filters LPF1 and LPF2 and the high-pass filter HPF (FIG. 4) is designed based on the consideration about such coupling of the magnetic flux generated by each of the inductors ind1, ind2 and ind3. Therefore, the high frequency part shown in FIG. 1 can maintain a desired filtering characteristics without any shield electrodes, regardless of the magnitude of the coupling of the magnetic flux generated by each of the inductors ind1, ind2 and ind3.

Such high frequency part as disclosed in the above-referenced Japan Patent Application No. 1998-117117 is designed so as to make the coupling of the magnetic flux lower as much as possible, in order to obtain a desired filtering characteristics. Therefore, as for such conventional high frequency part, it may be required to provide a sufficient space between the adjacent inductors so as to keep a low coupling of the magnetic flux as much as possible. In contrast, the inventive high frequency part 1 shown in FIG. 1 can gain a desired filtering characteristics by utilizing the coupling of the magnetic flux generated by each of the inductors ind1, ind2 and ind3. Accordingly, as for the inventive high frequency part, it is possible to provide the inductors ind1, ind2 and ind3 so as to be located closely each other, which may be resulted in a compact size of the high frequency part 1.

Besides, since each of inductors ind1, ind2 and ind3 in the inventive high frequency part 1 is positioned between the two grounding electrodes 31 and 131, those inductors ind1, ind2 and ind3 may not be much influenced by the environmental changes, so that a stable filtering characteristics can be obtained.

In some applications of the high frequency part 1, there is a possibility that the inductors ind1, ind2 and ind3 must be designed in such a way that a part of the inductors ind1, ind2 and ind3 is not within the area sandwiched by the two grounding electrodes 31 and 131. In such case, although the coupling of the magnetic flux generated by the inductors ind1, ind2 and ind3 may become lower, it may be still possible to obtain a desired filtering characteristics and a small size of the high frequency part by designing the filtering characteristics of the high frequency part based on the coupling of the magnetic flux generated by the inductors ind1, ind2 and ind3 that may be properly positioned closely each other.

The high frequency part 1 in this embodiment comprises the dielectric substrate 2 that consists of a material containing ceramics as its principal ingredient. However, in some applications of the high frequency part 1, the high frequency part 1 may comprise, instead of the dielectric substrate 2, such alternative substrate that may consist of a magnetic material as its principal ingredient or a material containing mixtures of dielectric and magnetic materials with an appropriate mixture rate.

Besides, in this embodiment, although each of the two grounding electrodes 31 and 131 is included in the inside of the dielectric substrate 2, those grounding electrodes 31 and 131 may be positioned on the outer surface of the dielectric substrate 2. Also, in this embodiment, each of the coils A, B and C has about two spiral rounds but such number of the rounds may vary with specific applications of the high frequency part 1. Further, in this embodiment, the coil C, among the coils A, B and C, has no contact with any terminal of the terminals 3–8 mounted in the outer surface of the dielectric substrate 2. However, whether coils and terminals are connected to each other or not depends on the use of the high frequency part 1. Moreover, in this embodiment, although the number of the coils formed in the high frequency part 1 is three, that number may be two or even 4 or more according to specific applications of the high frequency part 1. Furthermore, although the high frequency part 1 has been presented as an exemplary electronic part in this embodiment, the invention may be applied to any electronic part to be used in the low frequency range as well.

Figure 5:
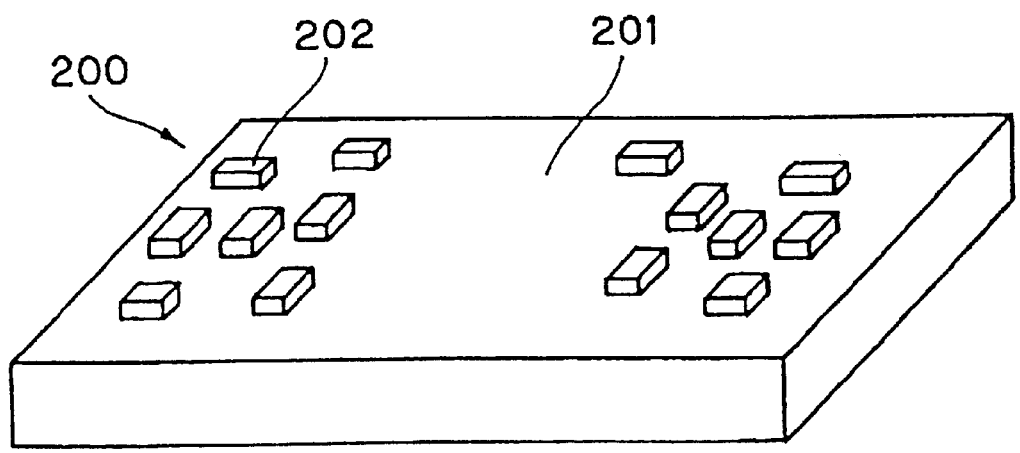
FIG. 5 illustrates one embodiment of an electronic device 200 in accordance with the invention.

FIG. 5 illustrates an electric device in accordance with one embodiment of the invention. The electric device 200 shown in FIG. 5 comprises an electronic part 201 taking the form of a flat sheet. The inside of the electronic part 201 contains a plurality of coils (not shown) having spirals oriented in the vertical direction. And the inside of the electronic part 201 also has two grounding electrodes (not shown) aligned in the vertical direction in such a way that the plurality of coils are located between the two grounding electrodes. Additionally, a plurality of electronic parts 202, which have a different structure than that of the electronic part 201, are mounted on the upper surface of the electronic part 201. In particular, in this example, there are fourteen electronic parts 202. The electronic part 201 and these fourteen electronic parts 202 are electrically connected to each other.

Since fourteen electronic parts are already mounted in the electronic part 201 that is provided for the complex electric device 200, when the complex electric device 200 is mounted on a circuit board, other fourteen electronic parts 201 can be mounted on the circuit board only by providing a sufficient area to mount the electronic part 201 on the circuit board. Accordingly, such area to mount 14 electronic parts 201 on the circuit board may not be necessary and as a result it may be possible to efficiently mount a number of electronic parts on the circuit board.

Figure 6:
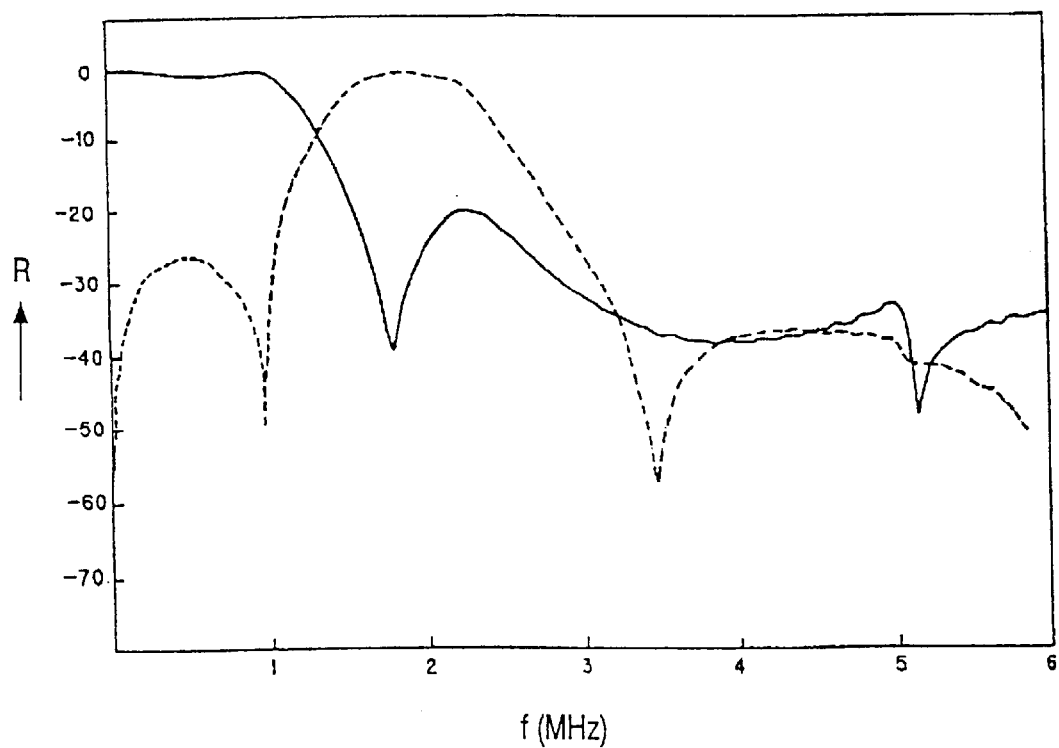
FIG. 6 is a graphical chart illustrating the filtering characteristics of the high frequency part 1 shown in FIG. 1.

Now, an example of the embodiments of the invention will be described below. FIG. 6 is a graphical chart illustrating the filtering characteristics of the high frequency part 1 shown in FIG. 1. The X-axis represents the frequency f. The Y-axis represents a ratio R between the output power of the signal at the terminals T2, T3 shown in FIG. 4 (corresponding the output terminals 5, 3 shown in FIG. 1) and the input power of the signal at the terminal T1 (corresponding to the input terminal 7 shown in FIG. 1), on condition that the signal is input from the terminal T1.

The solid line represents a ratio between the output power at the terminal T2 and the input power at the terminal T1, the broken line represents a ratio between the output power at the terminal T3 and the input power at the terminal T1.

As seen in the graph, signals in the low frequency range of 0 GHz through 1 GHz are efficiently output from the terminal T2 without any significant attenuation because of the cooperation of the low-pass filter LPF1 and the low-pass filter LPF2 (see FIG. 4), and, on the other hand, signals in the high frequency range of 1.6 GHz through 2.2 GHz are efficiently output from the terminal T3 without any significant attenuation because of the cooperation of the low-pass filter LPF1 and the high-pass filter HPF (see FIG. 4). Thus, it may be possible to retrieve signals having different frequencies by using the high frequency part 1.

Consequently, as described above, the compact size of electronic parts without any shield electrode can be realized in accordance with the invention.

What is claimed is:

1. An electronic part, comprising:
   a substrate that contains at least one material selected from a dielectric material and a magnetic material;
   at least two coils that are formed in an inside of the substrate, the at least two coils taking the form of a spiral and extending in a predetermined direction;
   two grounding electrodes that are located in the inside or on an outer surface of the substrate, the two grounding electrodes being aligned in the predetermined direction in such a way that the at least two coils are located between the two ground electrodes;
   a first filter that is located in the inside of the substrate, the first filter containing at least one of the at least two coils; and
   a second filter that is located in the inside of the substrate, the second filter containing at least one other coil of the at least two coils, wherein the first filter and the second filter have the mutually different pass-bands.

2. An electronic part as claimed in claim 1, wherein the at least two coils are formed within such area of the substrate that is sandwiched by the two grounding electrodes.

3. An electronic part as claimed in claim 1, wherein the at least two coils taking the form of a spiral have at least one round.

4. An electronic part as claimed in claim 1, wherein the electronic part further comprises an external electrode that is located on the outer surface of the substrate and wherein at least one of the at least two coils maintains no contact with the external electrode.

5. An electronic part as claimed in claim 1, wherein the electronic part further comprises an internal electrode that is located between one of the two grounding electrodes and at least one of the at least two coils.

6. An electronic part, comprising:
   a substrate that contains at least one material selected from a dielectric material and a magnetic material;
   at least two coils that are formed in an inside of the substrate, the at least two coils taking the form of a spiral and extending in a predetermined direction;
   two grounding electrodes that are located in the inside or on an outer surface of the substrate, the two grounding electrodes being aligned in the predetermined direction in such a way that the at least two coils are located between the two ground electrodes;
   a first means for filtering that is located in the inside of the substrate, the first means for filtering containing at least one of the at least two coils; and
   a second means for filtering that is located in the inside of the substrate, the second means for filtering containing at least one other coil of the at least two coils, wherein the first means for filtering and the second means for filtering have the mutually different pass-bands.

7. An electronic part as claimed in claim 6, wherein the at least two coils are formed within such area of the substrate that is sandwiched by the two grounding electrodes.

8. An electronic part as claimed in claim 6, wherein the at least two coils taking the form of a spiral have at least one round.

9. An electronic part as claimed in claim 6, wherein the electronic part further comprises an external electrode that is located on the outer surface of the substrate and wherein at least one of the at least two coils maintains no contact with the external electrode.

10. An electronic part as claimed in claim 6, wherein the electronic part further comprises an internal electrode that is located between one of the two grounding electrodes and at least one of the at least two coils.

11. A complex electronic device, comprising:
    a first electronic part, and at least one second electronic part, wherein at least one of the first and second electronic parts comprises:
    a substrate that contains at least one material selected from a dielectric material and a magnetic material;
    at least two coils that are formed in an inside of the substrate, the at least two coils taking the form of a spiral and extending in a predetermined direction;
    two grounding electrodes that are located in the inside or on an outer surface of the substrate, the two grounding electrodes being aligned in the predetermined direction in such a way that the at least two coils are located between the two ground electrodes;
    a first filter that is located in the inside of the substrate, the first filter containing at least one of the at least two coils; and
    a second filter that is located in the inside of the substrate, the second filter containing at least one other coil of the at least two coils, wherein the first filter and the second filter have the mutually different pass-bands.

12. A complex electronic device as claimed in claim 11, wherein the at least two coils are formed within such area of the substrate that is sandwiched by the two grounding electrodes.

13. A complex electronic device as claimed in claim 11, wherein the at least two coils taking the form of a spiral have at least one round.

14. A complex electronic device as claimed in claim 11, wherein the electronic part further comprises an external electrode that is located on the outer surface of the substrate and wherein at least one of the at least two coils maintains no contact with the external electrode.

15. A complex electronic device as claimed in claim 11, wherein the electronic part further comprises an internal electrode that is located between one of the two grounding electrodes and at least one of the at least two coils.

16. A mobile phone comprising the complex electronic device accordance with claim 11.

* * * * *